United States Patent
Kwon et al.

(10) Patent No.: US 9,882,112 B2
(45) Date of Patent: Jan. 30, 2018

(54) MULTI-QUBIT DEVICE AND QUANTUM COMPUTER INCLUDING THE SAME

(71) Applicant: SAMSUNG ELECTRONICS CO., LTD., Suwon-si (KR)

(72) Inventors: Hyeokshin Kwon, Seongnam-si (KR); Youngtek Oh, Yongin-si (KR); Insu Jeon, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 15/388,668

(22) Filed: Dec. 22, 2016

(65) Prior Publication Data

US 2017/0186934 A1     Jun. 29, 2017

(30) Foreign Application Priority Data

Dec. 24, 2015 (KR) .................. 10-2015-0186774

(51) Int. Cl.
*H01L 21/06* (2006.01)
*H01L 39/22* (2006.01)
*G06N 99/00* (2010.01)
*H01L 27/18* (2006.01)

(52) U.S. Cl.
CPC ......... *H01L 39/223* (2013.01); *G06N 99/002* (2013.01); *H01L 27/18* (2013.01)

(58) Field of Classification Search
CPC ..... H01L 27/18; H01L 39/025; H01L 39/045; H01L 39/223; H01L 39/2493; G06N 99/002

USPC ................................. 257/31; 438/2
See application file for complete search history.

(56) References Cited

U.S. PATENT DOCUMENTS

| | | |
|---|---|---|
| 6,285,186 B1 | 9/2001 | Morooka |
| 7,042,005 B2 | 5/2006 | Il'ichev et al. |
| 8,169,231 B2 | 5/2012 | Berkley |
| 8,405,468 B2 | 3/2013 | Uchaykin |
| 8,437,818 B1 | 5/2013 | Tolpygo et al. |
| 8,951,808 B2 | 2/2015 | Ladizinsky et al. |
| 2003/0193097 A1 | 10/2003 | Ll'ichev et al. |
| 2009/0015317 A1 | 1/2009 | DiVincenzo et al. |
| 2009/0078931 A1 | 3/2009 | Berkley |

(Continued)

OTHER PUBLICATIONS

Communication dated May 15, 2017 by the European Patent Office in counterpart European Patent Application No. 16206509.8.

*Primary Examiner* — Brook Kebede
(74) *Attorney, Agent, or Firm* — Sughrue Mion, PLLC

(57) ABSTRACT

Multi-qubit devices and quantum computers including the same are provided. The multi-qubit device may include a first layer including a plurality of qubits; a second layer that is disposed on the first layer, and comprises a plurality of flux generating elements that apply flux to the plurality of qubits, a plurality of wire patterns that provide current to the plurality of flux generating elements, and a plurality of plugs that are disposed perpendicular to the plurality of flux generating elements and the plurality of wire patterns and interconnect the plurality of flux generating elements and the plurality of wire patterns. Each of the plurality of flux generating elements may be integrated with a corresponding one of the plurality of wire patterns and a corresponding one of the plurality of plugs.

26 Claims, 13 Drawing Sheets

(56) References Cited

U.S. PATENT DOCUMENTS

2016/0093790 A1\* 3/2016 Rigetti .................. H01L 39/223
  257/31
2016/0364653 A1\* 12/2016 Chow .................. G06N 99/002

\* cited by examiner

MULTI-QUBIT DEVICE AND QUANTUM COMPUTER INCLUDING THE SAME

CROSS-REFERENCE TO RELATED APPLICATION

This application claims priority from Korean Patent Application No. 10-2015-0186774, filed on Dec. 24, 2015 in the Korean Intellectual Property Office, the disclosure of which is incorporated herein by reference in its entirety.

BACKGROUND

1. Field

Exemplary embodiments relate to devices including quantum bits (qubits).

2. Description of the Related Art

A quantum computer may be defined as a computing apparatus using quantum mechanical phenomena such as quantum superposition and quantum entanglement as operation principles thereof to process data. A unit device capable of storing data using quantum mechanical principles (or the data itself) is called a quantum bit or a qubit, and may be used as a basic unit of data in a quantum computer.

A bit used in a typical data storage apparatus has a state of "0" or "1" but a qubit may simultaneously have states of "0" and "1" based on superposition. In addition, interaction is enabled among qubits based on entanglement. Due to the above characteristics of qubits, $2^N$ data may be created using N qubits. Accordingly, if the number of qubits is increased, the amount of data and the speed of processing may be increased exponentially.

As interests in quantum computers are increased, research has been conducted on various types of qubits. Qubits using a superconductor (i.e., superconducting qubits) may be easily produced as integrated circuits. However, when a device including a plurality of qubits and a quantum computer using the same are implemented, various problems such as undesired interference between constituent elements (devices) and noise caused thereby should be solved.

SUMMARY

One or more exemplary embodiments provide multi-qubit devices capable of easily controlling the state of qubits using flux.

Further, one or more exemplary embodiments provide multi-qubit devices capable of suppressing or preventing undesired interference between constituent elements or noise caused thereby.

Further still, one or more exemplary embodiments provide multi-qubit devices capable of increasing scalability thereof.

Further still, one or more exemplary embodiments provide multi-qubit devices capable of increasing the degree of freedom in designing and aligning a plurality of qubits and peripheral devices/circuits thereof.

Further still, one or more exemplary embodiments provide quantum computers including the multi-qubit devices.

According to an aspect of an exemplary embodiment, there is provided a multi-qubit device including: a first layer structure disposed on a substrate in a vertical direction of the multi-quit device and comprising an array of a plurality of qubits; and a second layer structure disposed between the substrate and the first layer structure and comprising a plurality of flux generating elements that apply flux to the plurality of qubits in the vertical direction, wherein each of the plurality of qubits and each of the plurality of flux generating elements corresponding to the plurality of qubits have centers that are aligned on substantially a same axis in the vertical direction.

Each of the plurality of qubits may be a superconducting qubit.

Each of the plurality of qubits may include at least one Josephson junction.

Each of the plurality of qubits may include a closed loop structure and at least one Josephson junction disposed on the closed loop structure, and may further include a first electrode line and a second electrode line that extends in parallel to the first electrode from a side of the closed loop structure.

Each of the plurality of flux generating elements may include a partially open loop structure and may further include a first wire pattern and a second wire pattern that extends in parallel to first wire pattern from the partially open loop structure.

The partially open loop structure may have a size less than or equal to a size of the closed loop structure.

The first and second wire patterns may extend in a direction in which the first and second electrode lines extend.

A distance between the first and second wire patterns may be less than or equal to a distance between the first and second electrode lines.

Each of the plurality of flux generating elements may include a superconducting material.

The multi-qubit device may further include an insulating layer that has a thickness less than or equal to 100 nm and is disposed between the plurality of flux generating elements and the plurality of qubits.

The multi-qubit device may further include a plurality of wire patterns connected to each of the plurality of flux generating elements, and the plurality of wire patterns may be disposed at a level different from a level of the plurality of flux generating elements in the vertical direction. The plurality of qubits may be disposed closer to the plurality of flux generating elements than to the plurality of wire patterns.

The multi-qubit device may further include: an insulating layer that is disposed between the plurality of flux generating elements and the plurality of wire patterns and includes a plurality of via holes; and plugs that are disposed in the via holes and interconnect the plurality of flux generating elements and the plurality of wire patterns.

The insulating layer may have a thickness greater than equal to 100 nm.

The plurality of flux generating elements may be a plurality of first flux generating elements, and the multi-qubit device may further include a third layer structure that faces the first layer structure wherein the first layer structure may be disposed between the second layer structure and the third layer structure. The third layer structure may include a plurality of second flux generating elements that applies flux to the plurality of qubits in the vertical direction.

The plurality of second flux generating elements may be symmetrical to the plurality of first flux generating elements.

According to an aspect of another embodiment, there is provided a quantum computer including the multi-qubit device.

According to an aspect of another exemplary embodiment, there is provided a multi-qubit device including: a layer structure including a plurality of qubits; a plurality of first flux generating elements that are disposed under the layer structure in a vertical direction of the multi-quit device and apply flux to the plurality of qubits in the vertical direction; and a plurality of second flux generating elements that are disposed above and on the layer structure in the vertical direction and apply flux to the plurality of qubits in the vertical direction.

Each of the plurality of first flux generating elements may be symmetrical to each of the plurality of second flux generating elements corresponding to the plurality of first flux generating elements.

Each of the plurality of qubits may include a closed loop structure and at least one Josephson junction disposed on the closed loop structure, and may further include a first electrode line and a second electrode line that extends in parallel to the first electrode line from a side of the closed loop structure.

Each of the plurality of first flux generating elements may include a first partially open loop structure, each of the plurality of second flux generating elements may include a second partially open loop structure. The multi-qubit device may further include a first wire pattern and a second wire pattern that extends in parallel to the first wire pattern from the first partially open loop structure; and a third wire pattern and a fourth wire pattern that extends in parallel to the third wire pattern from the second partially open loop structure.

The first and second partially open loop structures may have a size less than or equal to a size of the closed loop structure.

The first and second wire patterns and the third and fourth wire patterns may extend in a direction in which the first and second electrode lines extend.

The first and second wire patterns may be disposed at a level different from a level of the first partially open loop structure in the vertical direction. In this case, at least a part of the first and second wire patterns may extend in a direction different from a direction in which the first and second electrode lines extend.

The third and fourth wire patterns may be disposed at a level different from a level of the second partially open loop structure in the vertical direction. In this case, at least a part of the third and fourth wire patterns may extend in a direction different from the direction of the first and second electrode lines.

The plurality of first flux generating elements may be provided on a substrate, a first insulating layer covering the plurality of first flux generating elements may be provided on the substrate, the plurality of qubits may be provided on the first insulating layer, a second insulating layer covering the plurality of qubits may be provided on the first insulating layer, and the plurality of second flux generating elements may be provided on the second insulating layer. The plurality of first flux generating elements may be disposed on a substrate. The multi-qubit device may further include: a first insulating layer that is disposed on the substrate and covers the plurality of first flux generating elements; and a second insulating layer that is disposed on the first insulating layer and covers the plurality of qubits. The plurality of qubits may be disposed on the first insulating layer and the plurality of second flux generating elements are disposed on the second insulating layer.

According to an aspect of another exemplary embodiment, there is provided a quantum computer including the multi-qubit device.

According to an aspect of another exemplary embodiment, there is provided a multi-qubit device including: a first layer comprising a plurality of qubits; a second layer that is disposed on the first layer, and comprises a plurality of flux generating elements that apply flux to the plurality of qubits, a plurality of wire patterns that provide current to the plurality of flux generating elements, and a plurality of plugs that are disposed perpendicular to the plurality of flux generating elements and the plurality of wire patterns and interconnect the plurality of flux generating elements and the plurality of wire patterns, wherein each of the plurality of flux generating elements is integrated with a corresponding one of the plurality of wire patterns and a corresponding one of the plurality of plugs.

Each of the plurality of qubits and each of the plurality of flux generating elements corresponding thereto may have shapes corresponding to each other and centers thereof may be aligned on substantially the same vertical axis.

According to an aspect of another exemplary embodiment, a quantum computer includes the above multi-qubit device.

BRIEF DESCRIPTION OF THE DRAWINGS

The above and/or other aspects will be more apparent by describing certain exemplary embodiments, with reference to the accompanying drawings, in which.

DETAILED DESCRIPTION

Figure 1:
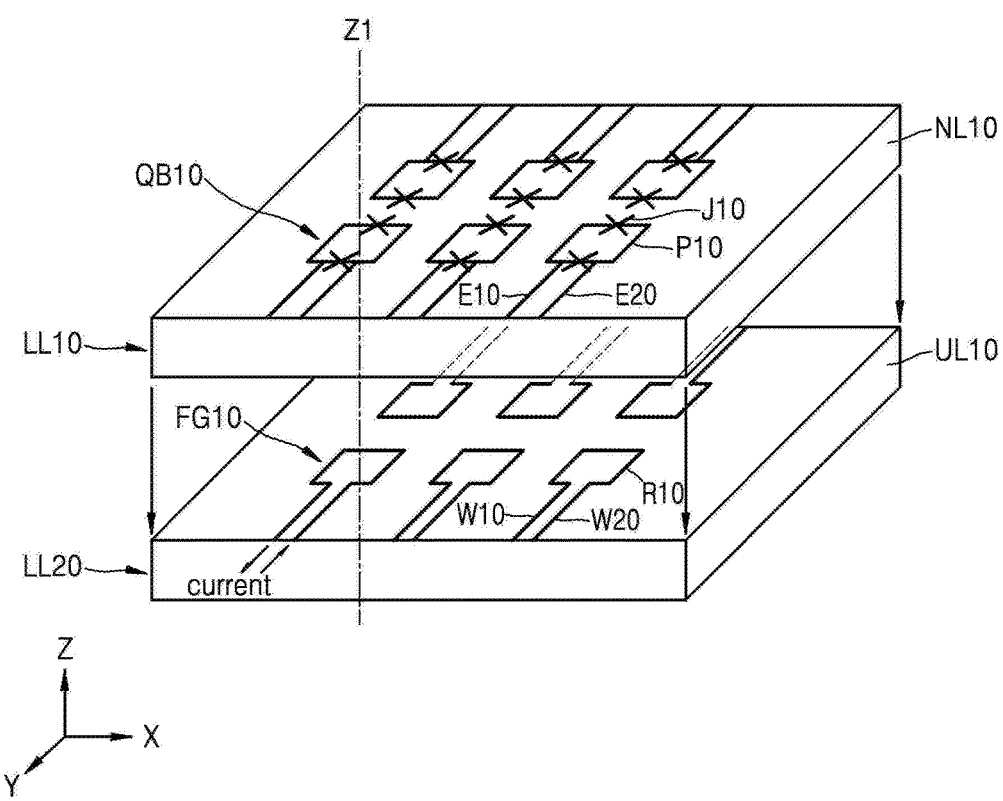
FIG. 1 is a perspective view of a multi-qubit device according to an exemplary embodiment.

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view of a multi-qubit device according to an exemplary embodiment.

Referring to FIG. 1, the multi-qubit device includes a first layer structure LL10 and a second layer structure LL20. The first layer structure LL10 may include a plurality of qubits QB10, and an insulating layer NL10 on which the qubits QB10 are aligned. The qubits QB10 may be aligned two-dimensionally. The alignment scheme and the number of the qubits QB10 illustrated in FIG. 1 are examples and may vary.

The second layer structure LL20 may be disposed under the first layer structure LL10. The second layer structure LL20 may include a plurality of flux generating elements FG10 that apply flux to the qubits QB10. The flux generating elements FG10 may be provided on an underlayer UL10. Thus, the second layer structure LL20 may include the underlayer UL10 and the flux generating elements FG10 aligned thereon. Alternatively, an array itself of the flux generating elements FG10 may be regarded as the second layer structure LL20. The underlayer UL10 may include a substrate. Alternatively, an additional substrate may be further provided under the underlayer UL10. Accordingly, the second layer structure LL20 may be provided between the substrate and the first layer structure LL10.

By applying a current to each flux generating element FG10, a flux, i.e., a magnetic flux, may be generated therefrom. The state of the qubit QB10 may be controlled using the flux. For example, the state of the qubit QB10 may be initialized or may be controlled for another purpose using the flux. By controlling the intensity, direction, duration, or the like of the current applied to the flux generating element FG10, the intensity, direction, duration, or the like of the flux generated therefrom may be changed and the state of the qubit QB10 may be tuned for a desired purpose.

The qubit QB10 and the flux generating element FG10 may correspond to each other one to one. The qubit QB10 and the flux generating element FG10 corresponding thereto may have shapes corresponding to each other. In other words, the qubit QB10 and the flux generating element FG10 may have the same shape or substantially the same shape. In addition, the qubit QB10 and the flux generating element FG10 corresponding thereto may be arranged to align the centers thereof on substantially the same vertical axis Z1. Further, the qubit QB10 and the flux generating element FG10 may face each other directly. The fact that the centers of the qubit QB10 and the flux generating element FG10 corresponding thereto are aligned on substantially the same vertical axis Z1 may mean that, when viewed from the top, the centers thereof exactly or mostly (substantially) match. In this case, a certain level of error (tolerance) generated in a manufacturing process may be allowable. For example, when viewed from the top, the center of the qubit QB10 and the center of the flux generating element FG10 corresponding thereto may exactly match or may have a deviation within about 20 nm or about 10 nm. Meanwhile, the width of each of the qubit QB10 and the flux generating element FG10 may be several μm to several ten μm. However, in some cases, the width of each of the qubit QB10 and the flux generating element FG10 may be less than about 1 μm.

The qubit QB10 may be, for example, a 'superconducting qubit' using a superconductor. In this case, the qubit QB10 may include a loop structure P10 formed of a superconductor. The loop structure P10 may be a closed loop structure. In addition, the qubit QB10 may further include at least one Josephson junction J10 provided on the loop structure P10. The Josephson junction J10 may include two superconductors and a dielectric layer provided therebetween. For convenience, the Josephson junction J10 is marked with a symbol X in FIG. 1. A description of the structure (stack structure) of the Josephson junction J10 will be given below with reference to FIG. 2. Although one qubit QB10 includes two Josephson junctions J10 in FIG. 1, the number of Josephson junctions J10 is not limited to two. Furthermore, the location of the Josephson junction J10 in the qubit QB10 may be changed.

The superconductor (superconducting material) of the qubit QB10 may be, for example, aluminum (Al), niobium (Nb), or lead (Pb). In other words, the superconductor included in the loop structure P10 and the Josephson junction J10 may be Al, Nb, or Pb. Charges (electrons) may move without resistance in the qubit QB10. That is, a superconducting current may flow through the qubit QB10. Specifically, a Cooper pair consisting of two electrons may rotate along the loop structure P10 without resistance. In this case, the Cooper pair may tunnel through the Josephson junction J10 and may generate the superconducting current irrespective of a tunneling barrier. Depending on the location or state of the Cooper pair, the state of the qubit QB10 may be determined.

First and second electrode lines E10 and E20 may extend in parallel to each other from a side of the loop structure P10. For example, the first and second electrode lines E10 and E20 may extend in parallel to the Y axis. The first and second electrode lines E10 and E20 may be called a wire structure for applying an electrical signal to the qubit QB10. The distance between the first and second electrode lines E10 and E20 may be less than the X-direction width of the loop structure P10. The first and second electrode lines E10 and E20 may be formed of a superconducting material, e.g., Al, Nb, or Pb. The first and second electrode lines E10 and E20 may be formed of the same material as the loop structure P10 and may be provided at a level (height) equal to the level (height) of the loop structure P10.

The flux generating element FG10 may have a shape corresponding to the shape of the qubit QB10. For example, the flux generating element FG10 may have a loop structure R10. The loop structure R10 of the flux generating element FG10 may be a partially open loop structure. The loop structure R10 itself may be regarded as the flux generating element FG10. The loop structure R10 may be formed of a superconducting material, e.g., Al, Nb, or Pb. The center of the loop structure R10 and the center of the loop structure P10 of the qubit QB10 corresponding thereto may be aligned on substantially the same vertical axis Z1. The loop structure R10 of the flux generating element FG10 may have a size equal to or less than the size of the loop structure P10 of the qubit QB10. In this case, the flux generated by the flux generating element FG10 may be focused on and applied to the loop structure P10 of the qubit QB10.

First and second wire patterns W10 and W20 may extend in parallel to each other from two ends of the loop structure R10. The first and second wire patterns W10 and W20 may apply an electrical signal (current) to the loop structure R10. The first and second wire patterns W10 and W20 may extend in a direction equal to the direction of the first and second electrode lines E10 and E20 (herein, a direction parallel to the Y axis). In addition, the distance between the first and second wire patterns W10 and W20 may be less than or equal to the distance between the first and second electrode lines E10 and E20. The first and second wire patterns W10 and W20 may be formed of the same superconducting material as the loop structure R10, e.g., Al, Nb, or Pb. If the flux generating element FG10 (i.e., R10) and the first and second wire patterns W10 and W20 are formed of the superconducting material, a flux may be generated without generating heat or thermal noise due to application of a current. Accordingly, an increase in temperature of the qubit QB10 adjacent thereto may be prevented.

The loop structure P10 of the qubit QB10 may have a rectangular shape. For example, the loop structure P10 may have a square shape or a substantially square shape. In this case, the loop structure R10 of the flux generating element FG10 may have a partially open square shape or a shape similar thereto. According to another exemplary embodiment, the loop structure P10 of the qubit QB10 may have a circular shape. At this time, the loop structure R10 of the flux generating element FG10 may have a partially open circular shape. The shapes and locations of the qubit QB10 and the flux generating element FG10 will be described in detail below with reference to FIGS. 3 and 4.

In the current exemplary embodiment, the qubit QB10 and the flux generating element FG10 are arranged to be spaced apart from each other in a vertical direction (the Z direction), to have shapes corresponding to each other, and to align the centers thereof on substantially the same vertical axis Z1. In this case, the flux generated by the flux generating element FG10 may uniformly (or almost uniformly) influence the qubit QB10 corresponding thereto. In addition, the first and second electrode lines E10 and E20 connected to the qubit QB10 and the first and second wire patterns W10 and W20 connected to the flux generating element FG10 may also have shapes corresponding to each other and may extend in the same direction. At this time, the first and second wire patterns W10 and W20 may uniformly (or almost uniformly) influence the first and second electrode lines E10 and E20. In other words, the flux generating element FG10 and the first and second wire patterns W10 and W20 may uniformly (or almost uniformly) influence the qubit QB10 and the first and second electrode lines E10 and E20 corresponding thereto. Accordingly, undesired interference or noise between constituent elements may be suppressed.

In addition, the flux generating element FG10 may have a size less than or equal to the size of the qubit QB10, and the distance between the first and second wire patterns W10 and W20 may be less than or equal to the distance between the first and second electrode lines E10 and E20. Accordingly, the flux generated by the flux generating element FG10 may be focused on the qubit QB10 corresponding thereto and may hardly influence the other qubits QB10. Similarly, electromagnetic influence of the first and second wire patterns W10 and W20 may be focused on only the first and second electrode lines E10 and E20 corresponding thereto and may hardly influence the other first and second electrode lines E10 and E20 or the other qubits QB10. As such, the possibility of undesired interference or noise between constituent elements may be greatly reduced.

If a flux generating element is arranged at a side of a qubit (which is referred to as 'asymmetric arrangement' in this specification) unlike the current exemplary embodiment, flux generated by the flux generating element may not uniformly influence the qubit corresponding thereto and may easily generate noise to other adjacent qubits. In addition, wire patterns connected to the flux generating element may also generate flux noise which influences other peripheral qubits or circuits. Accordingly, if the flux generating element is arranged at a side of the qubit, the lifetime of the qubit may be shortened and the reliability of a device may be reduced due to noise. Particularly, if the number of qubits is increased, arrangement of qubits and flux generating elements may be hard and complicated.

However, according to the current exemplary embodiment, the qubit QB10 and the flux generating element FG10 may be arranged to be provided on different layers, to have shapes corresponding to each other, and to align the centers thereof on substantially the same vertical axis. Such arrangement may be referred to as 'symmetric arrangement' or 'corresponding arrangement' in this specification. In this case, as described above, undesired interference or noise may be suppressed and the lifetime and reliability of a device may be improved. In addition, the degree of freedom in designing a tunable multi-qubit device may be greatly improved.

Figure 2:
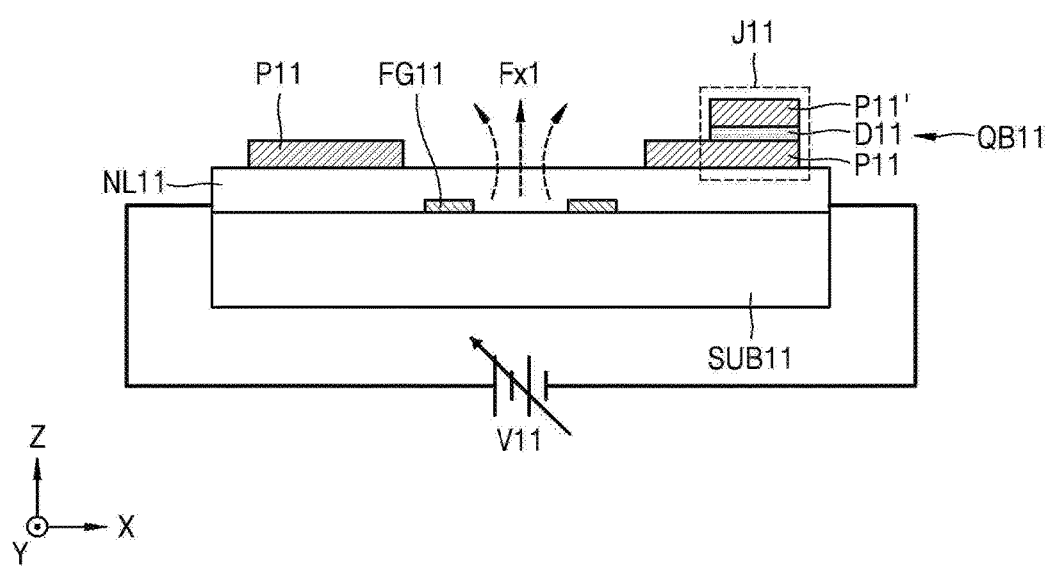
FIG. 2 is a cross-sectional view of a multi-qubit device corresponding to the exemplary embodiment of FIG. 1.

FIG. 2 is a cross-sectional view of a multi-qubit device corresponding to the exemplary embodiment of FIG. 1. For convenience, only a unit structure including one qubit QB11 and one flux generating element FG11 corresponding thereto is illustrated in and described in relation to FIG. 2.

Referring to FIG. 2, the flux generating element FG11 may be disposed on a substrate SUB11. The substrate SUB11 may be formed of a material (insulating material) having a high quality factor (i.e., a high Q value) to minimize influence on a coherence state of the qubit QB11. For example, a sapphire substrate or a silicon (Si) substrate may be used as the substrate SUB11. If the Si substrate is used, an insulating film such as a silicon oxide ($SiO_2$) layer may be provided on a surface thereof and then the flux generating element FG11 may be provided on the insulating film. The flux generating element FG11 may be formed of a superconducting material, e.g., Al, Nb, or Pb. First and second wire patterns may also be provided at a level equal to the level of the flux generating element FG11.

An insulating layer NL11 covering the flux generating element FG11 may be disposed on the substrate SUB11. The insulating layer NL11 may be formed of silicon oxide, silicon nitride, or a dielectric material having a dielectric constant greater than the dielectric constant of silicon nitride.

The qubit QB11 may be disposed on the insulating layer NL11. The qubit QB11 may include a loop structure P11 formed of a superconducting material and may further include at least one Josephson junction J11 provided on the loop structure P11. The Josephson junction J11 may include two superconductors (a part of P11 and P11') and a dielectric layer D11 provided therebetween. Although one Josephson junction J11 is illustrated in FIG. 2, two or more Josephson junctions J11 may be provided. The structure of the qubit QB11 may correspond to or be similar to the structure of the qubit QB10 of FIG. 1. The superconducting material included in the loop structure P11 and the Josephson junction J11 may be, for example, Al, Nb, or Pb. The dielectric layer D11 may be, for example, $Al_2O_3$ but is not limited thereto and may be variously changed.

A power source V11 may be electrically connected to the flux generating element FG11. The power source V11 may be connected to the flux generating element FG11 through wire patterns (W10 and W20 of FIG. 1). A current may be applied to the flux generating element FG11 using the power source V11 and thus flux Fx1 may be generated by the flux generating element FG11. The flux Fx1 may be applied to the qubit QB11 in a vertical direction. For example, the flux Fx1 may be applied to the inside of the loop structure P11. Depending on the direction of the current applied to the flux generating element FG11, the direction of the flux Fx1 may vary. The power source V11 may be, for example, a voltage source. In this case, the intensity of the flux Fx1 may be controlled by adjusting the intensity of a voltage applied to the flux generating element FG11 using the power source V11. An arrow marked on the power source V11 means that the intensity of the voltage is adjustable. The sign (symbol) indicating the power source V11 in FIG. 2 is an example and an actual configuration of the power source V11 may be variously changed.

The thickness of the insulating layer NL11 provided between the flux generating element FG11 and the qubit QB11 may be less than or equal to about 100 nm. In this case, the flux Fx1 generated by the flux generating element FG11 may be properly applied to and focused on the qubit QB11 corresponding thereto and may hardly influence the other qubits. If the thickness of the insulating layer NL11 is excessively large, the intensity of the flux Fx1 required to control the state of the qubit QB11 may be increased and thus power consumption may also be increased. However, in some cases, the insulating layer NL11 may be provided with a thickness greater than 100 nm. Furthermore, an additional insulating layer (protective layer) covering the qubit QB11 may be further provided on the insulating layer NL11.

Additionally, the flux generating element FG11 provided under the qubit QB11 as illustrated in FIG. 2 may be advantageous in terms of a manufacturing process. That is, a process of forming the flux generating element FG11 and then forming the qubit QB11 may be easier than the reverse process. In addition, if the flux generating element FG11 is formed and then the qubit QB11 is formed, the qubit QB11 may not be influenced by the process of forming the flux generating element FG11.

Figure 3:
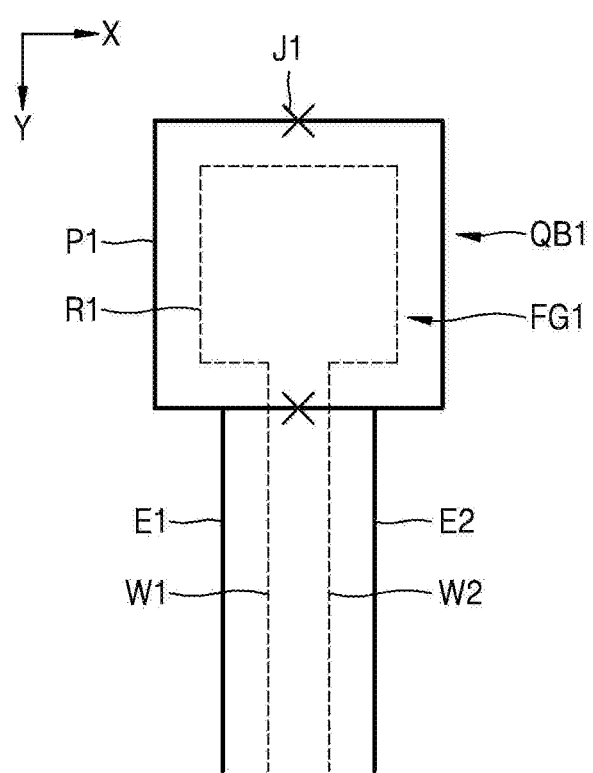
FIG. 3 is a plan view of a qubit and a flux generating element applicable to a multi-qubit device, according to an exemplary embodiment.

FIG. 3 is a plan view of a qubit QB1 and a flux generating element FG1 applicable to a multi-qubit device, according to an exemplary embodiment. FIG. 3 may correspond to a unit cell structure.

Referring to FIG. 3, the qubit QB1 and the flux generating element FG1 corresponding thereto may be prepared. The qubit QB1 may have a closed loop structure P1. The loop structure P1 may have a rectangular shape, e.g., a square shape. The flux generating element FG1 may have a partially open loop structure R1. The loop structure R1 may have a rectangular shape, e.g., a square shape. The loop structure P1 of the qubit QB1 and the loop structure R1 of the flux generating element FG1 may have shapes corresponding to each other as described above, and the centers thereof may be aligned on substantially the same vertical axis. The loop structure R1 of the flux generating element FG1 may have a size less than or equal to the size of the loop structure P1 of the qubit QB1.

First and second electrode lines E1 and E2 may be connected to the qubit QB1. In addition, first and second wire patterns W1 and W2 may be connected to the flux generating element FG1. The first and second electrode lines E1 and E2 and the first and second wire patterns W1 and W2 may extend in the same direction. The distance between the first and second wire patterns W1 and W2 may be less than or equal to the distance between the first and second electrode lines E1 and E2. Reference numeral J1 denotes at least one Josephson junction provided on the loop structure P1 of the qubit QB1.

Figure 4:
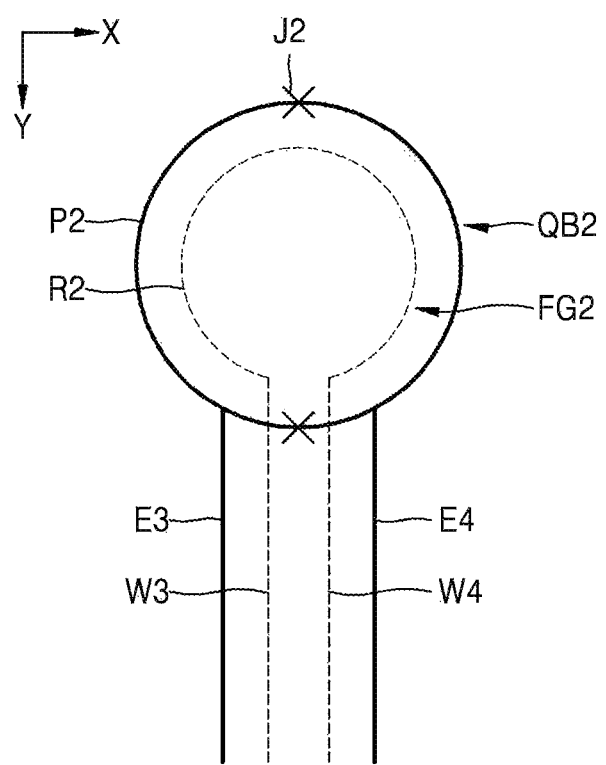
FIG. 4 is a plan view of a qubit and a flux generating element applicable to a multi-qubit device, according to another exemplary embodiment.

The qubit QB1 and the flux generating element FG1 of FIG. 3 may have circular shapes instead of rectangular shapes. An example thereof is illustrated in FIG. 4. FIG. 4 is a plan view of a qubit QB2 and a flux generating element FG2 applicable to a multi-qubit device, according to another exemplary embodiment.

Referring to FIG. 4, the qubit QB2 and the flux generating element FG2 corresponding thereto may have circular shapes. The qubit QB2 may have a closed circular loop structure P2 and the flux generating element FG2 may have a partially open circular loop structure R2. The loop structure P2 of the qubit QB2 and the loop structure R2 of the flux generating element FG2 may have shapes corresponding to each other, and the centers thereof may be aligned on substantially the same vertical axis. First and second electrode lines E3 and E4 may be connected to the qubit QB2, and first and second wire patterns W3 and W4 may be connected to the flux generating element FG2. The distance between the first and second wire patterns W3 and W4 may be less than or equal to the distance between the first and second electrode lines E3 and E4. Reference numeral J2 denotes at least one Josephson junction provided on the loop structure P2 of the qubit QB2.

Although the qubits QB1 and QB2 and the flux generating elements FG1 and FG2 have rectangular or circular shapes in FIGS. 3 and 4, the shapes thereof may be variously changed. For example, the qubits QB1 and QB2 and the flux generating elements FG1 and FG2 may have triangular shapes, five-or-more-sided polygonal shapes, or oval shapes.

Figure 5:
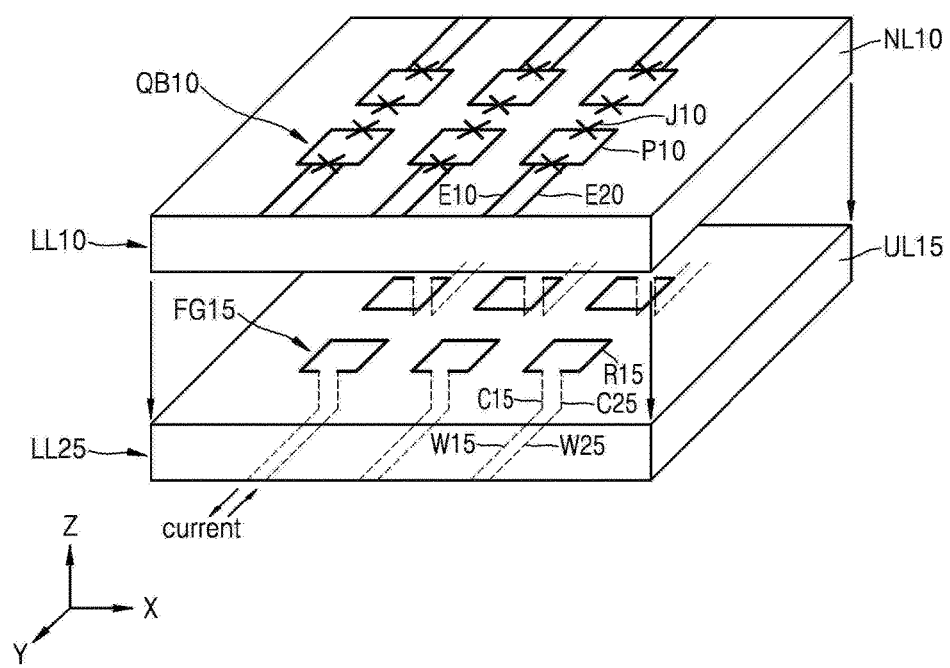
FIG. 5 is a perspective view of a multi-qubit device according to another exemplary embodiment.

FIG. 5 is a perspective view of a multi-qubit device according to another exemplary embodiment.

As shown in FIG. 5, the multi-qubit device includes the first layer structure LL10 described above in relation to FIG. 1. The first layer structure LL10 may include the insulating layer NL10 and the qubits QB10 aligned thereon. Each qubit QB10 may include the loop structure P10 and at least one Josephson junction J10, and the first and second electrode lines E10 and E20 may be connected to the qubit QB10.

A second layer structure LL25 may be disposed under the first layer structure LL10. The second layer structure LL25 may include a plurality of flux generating elements FG15 that apply flux to the qubits QB10. The flux generating elements FG15 may be the same as or similar to the flux generating elements FG10 described above in relation to FIG. 1. Accordingly, each of the flux generating elements FG15 may include a partially open loop structure R15. In addition, the flux generating elements FG15 may be provided on an underlayer UL15. The underlayer UL15 may be an insulating layer.

The second layer structure LL25 may further include a plurality of wire patterns W15 and W25 connected to each flux generating element FG15. The wire patterns W15 and W25 may be provided at a level (height) different from the level (height) of the flux generating element FG15. In this case, the wire patterns W15 and W25 may be provided far away from the qubit QB10 compared to the flux generating element FG15. The wire patterns W15 and W25 may include a first wire pattern W15 and a second wire pattern W25 connected to two ends of the flux generating element FG15.

A plurality of via holes may be provided in the underlayer UL15, and a plurality of plugs C15 and C25 that interconnect the flux generating element FG15 and the wire patterns W15 and W25 may be provided in the via holes. The plug C15 connected to the first wire pattern W15 may be referred to as a first plug, and the plug C25 connected to the second wire pattern W25 may be referred to as a second plug. For example, the entire portion of the plurality of plugs C15 and C25 may be buried inside the second layer structure LL25 and the open loop structure R15 may be disposed on the second layer structure LL25. A substrate or insulator may be further provided under the second layer structure LL25.

As in the current exemplary embodiment, the flux generating element FG15 and the wire patterns W15 and W25 connected thereto may be provided at different levels (heights), and the wire patterns W15 and W25 may be provided far away from the qubit QB10 compared to the flux generating element FG15. In this case, undesired interference or influence of the wire patterns W15 and W25 on the qubit QB10 may be further reduced. In other words, generation of noise due to the wire patterns W15 and W25 may be effectively suppressed or prevented. In addition, since the wire patterns W15 and W25 are separately arranged in a new space (on a new layer), the degree of freedom in design may be further improved. For example, in the current exemplary embodiment, since influence and/or interference of the wire patterns W15 and W25 on the qubit QB10 are suppressed or prevented, at least a part of the wire patterns W15 and W25 may be freely designed in a direction (extending direction) different from the direction of the first and second electrode lines E10 and E20. Accordingly, the structure of FIG. 5 has various advantages in terms of noise suppression and the degree of freedom in design.

Figure 6:
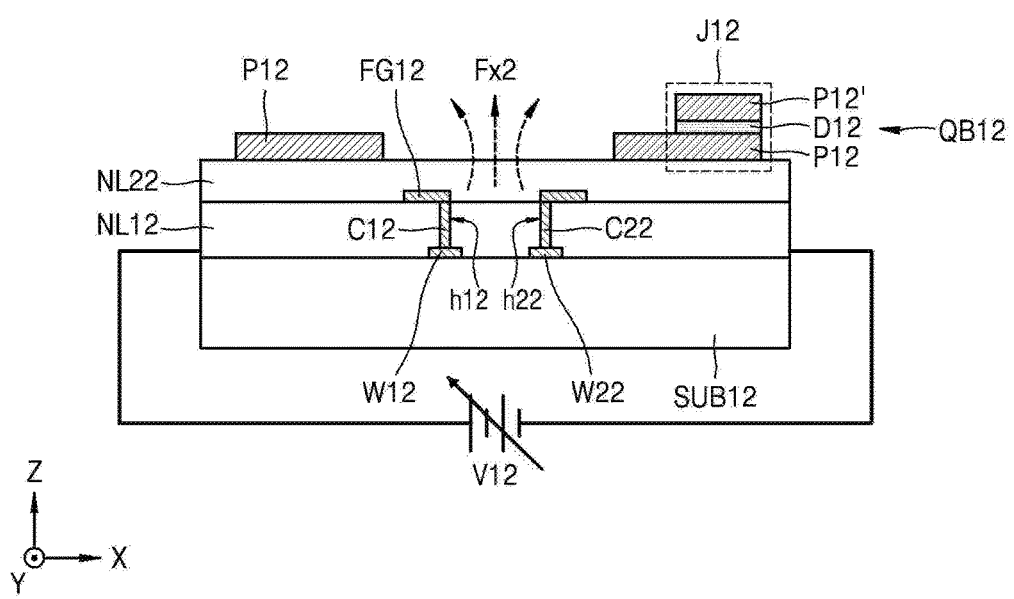
FIG. 6 is a cross-sectional view of a multi-qubit device corresponding to the exemplary embodiment of FIG. 5.

FIG. 6 is a cross-sectional view of a multi-qubit device corresponding to the exemplary embodiment of FIG. 5.

Referring to FIG. 6, a plurality of wire patterns W12 and W22 may be provided on a substrate SUB12. The substrate SUB12 may be the same as or similar to the substrate SUB11 described above in relation to FIG. 2. A first insulating layer NL12 covering the wire patterns W12 and W22 may be provided on the substrate SUB12. The first insulating layer NL12 may be formed of silicon oxide, silicon nitride, or a dielectric material having a dielectric constant greater than the dielectric constant of silicon nitride. A flux generating element FG12 may be provided on the first insulating layer NL12. A plurality of via holes h12 and h22 may be provided in the first insulating layer NL12, and a plurality of plugs C12 and C22 may be provided in the via holes h12 and h22. The plugs C12 and C22 may interconnect the wire patterns W12 and W22 and the flux generating element FG12. In addition, the plugs C12 and C22 may be disposed to be perpendicular to the wire patterns W12 and W22 and the flux generating element FG12. The wire patterns W12 and W22, the plugs C12 and C22, and the flux generating element FG12 may be formed of a superconducting material, e.g., Al, Nb, or Pb.

A second insulating layer NL22 may be disposed on the first insulating layer NL12, and a qubit QB12 may be disposed on the second insulating layer NL22. The second insulating layer NL22 may be the same as or similar to the insulating layer NL11 of FIG. 2. The qubit QB12 may be the same as or similar to the qubit QB11 of FIG. 2. Accordingly, the qubit QB12 may include a loop structure P12 formed of a superconducting material and may further include at least one Josephson junction J12 provided on the loop structure P12. The Josephson junction J12 may include two superconductors (a part of P12 and P12') and a dielectric layer D12 provided therebetween.

A power source V12 may be electrically connected to the flux generating element FG12. The power source V12 may be connected to the flux generating element FG12 through the wire patterns W12 and W22 and the plugs C12 and C22. A current may be applied to the flux generating element FG12 using the power source V12 and thus flux Fx2 may be generated by the flux generating element FG12. The flux Fx2 may be applied to the qubit QB12 in a vertical direction.

In the current exemplary embodiment, the thickness of the first insulating layer NL12 may be greater than or equal to about 100 nm. In this case, the distance between the wire patterns W12 and W22 and the qubit QB12 may be increased and undesired interference or influence therebetween may be effectively prevented or suppressed. Meanwhile, the thickness of the second insulating layer NL22 may be less than or equal to about 100 nm. In this case, the flux Fx2 generated by the flux generating element FG12 may be properly applied to and focused on the qubit QB12 corresponding thereto and may hardly influence the other qubits. As such, the thickness of the first insulating layer NL12 may be greater than the thickness of the second insulating layer NL22. However, the thicknesses of the first and second insulating layers NL12 and NL22 are examples and appropriate thickness ranges of the first and second insulating layers NL12 and NL22 may vary.

Figure 7:
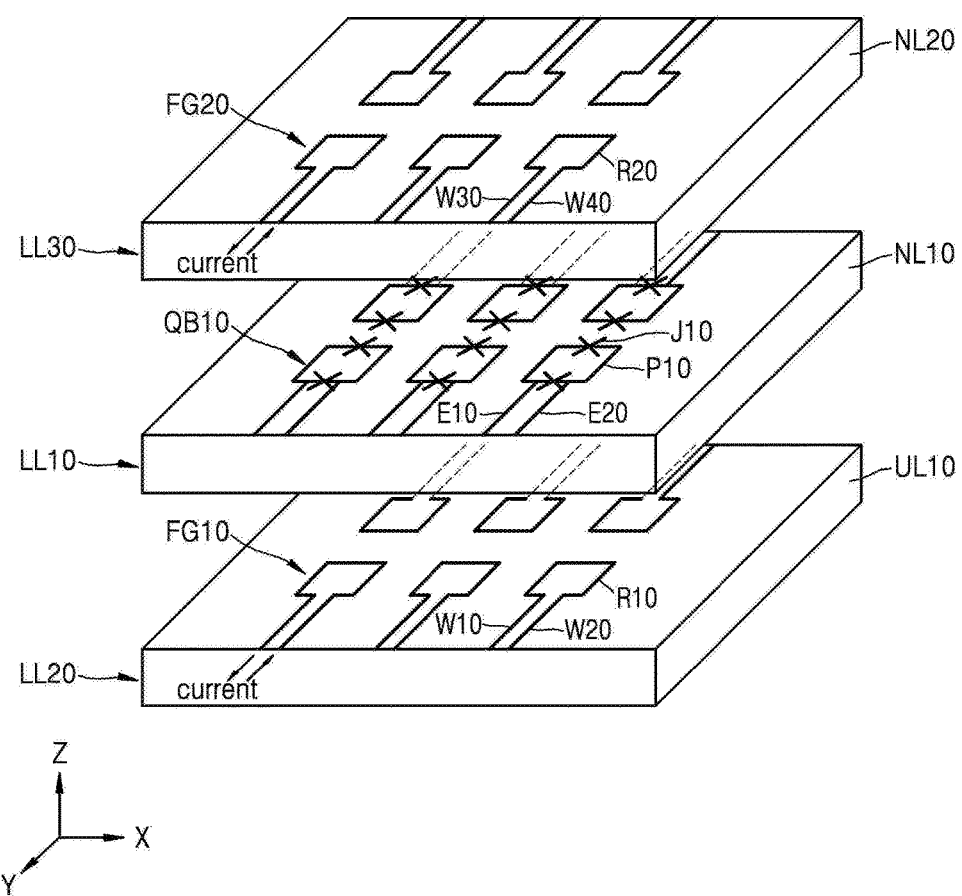
FIG. 7 is a perspective view of a multi-qubit device according to another exemplary embodiment.

FIG. 7 is a perspective view of a multi-qubit device according to another exemplary embodiment.

Referring to FIG. 7, the first layer structure LL10 described above in relation to FIG. 1 may be provided. The first layer structure LL10 may include the insulating layer NL10 and the qubits QB10 aligned thereon. Hereinafter, the insulating layer NL10 is referred to as a first insulating layer.

A second layer structure LL20 may be disposed under the first layer structure LL10. The second layer structure LL20 may be the same as the second layer structure LL20 described above in relation to FIG. 1. The second layer structure LL20 may include a plurality of flux generating elements FG10 provided on an underlayer UL10. Hereinafter, the flux generating elements FG10 are referred to as first flux generating elements.

The multi-qubit device according to the current exemplary embodiment may further include a third layer structure LL30 facing the second layer structure LL20 by intervening the first layer structure LL10 therebetween. Accordingly, the first layer structure LL10 may be located between the second and third layer structures LL20 and LL30. The third layer structure LL30 may include a plurality of second flux generating elements FG20 that apply flux to the qubits QB10 in a vertical direction. The second flux generating elements FG20 may be provided on a second insulating layer NL20. The second flux generating elements FG20 may be symmetrical to the first flux generating elements FG10 by intervening the qubits QB10 therebetween. Accordingly, each second flux generating element FG20 may have, for example, a partially open loop structure R20. The shape and size of the partially open loop structure R20 may be the same as or similar to the shape and size of a loop structure R10 of the first flux generating element FG10.

The third layer structure LL30 may further include a plurality of wire patterns W30 and W40 connected to the second flux generating element FG20. The wire patterns W30 and W40 may include a first wire pattern W30 and a second wire pattern W40 connected to two ends of the second flux generating element FG20. The extending direction of and the distance between the first and second wire patterns W30 and W40 may be the same as or similar to the extending direction of and the distance between the first and second wire patterns W10 and W20 connected to the first flux generating element FG10. Accordingly, the first and second wire patterns W30 and W40 connected to the second flux generating element FG20 may extend in a direction equal to the direction of the first and second electrode lines E10 and E20, and the distance between the first and second wire patterns W30 and W40 may be less than or equal to the distance between the first and second electrode lines E10 and E20.

Figure 8:
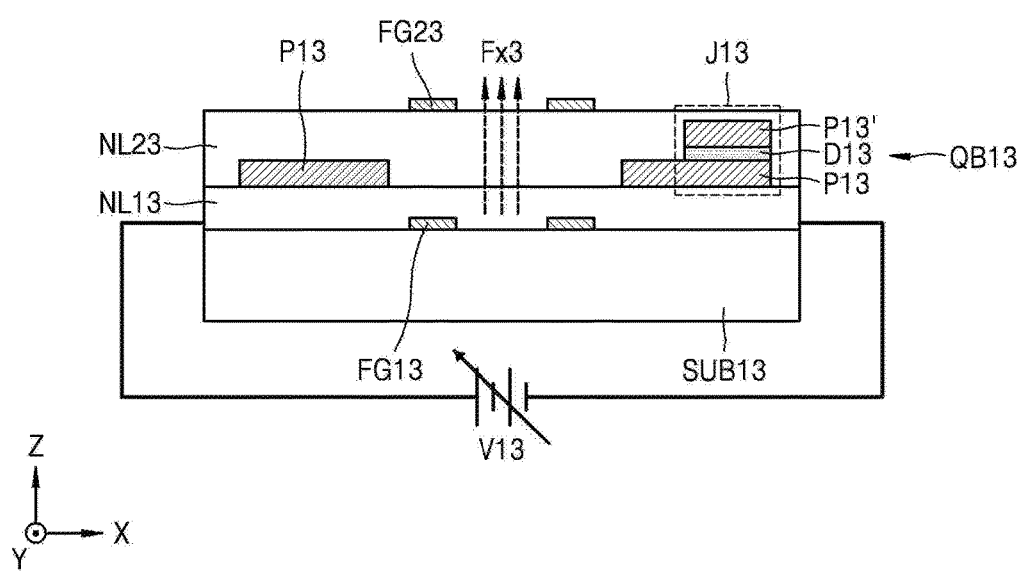
FIG. 8 is a cross-sectional view of a multi-qubit device corresponding to the exemplary embodiment of FIG. 7.

FIG. 8 is a cross-sectional view of a multi-qubit device corresponding to the exemplary embodiment of FIG. 7.

Referring to FIG. 8, a first flux generating element FG13 may be provided on a substrate SUB13. A first insulating layer NL13 covering the first flux generating element FG13 may be provided on the substrate SUB13. A qubit QB13 may be provided on the first insulating layer NL13. The qubit QB13 may include a loop structure P13 and at least one Josephson junction J13 provided thereon. The Josephson junction J13 may include two superconductors (a part of P13 and P13') and a dielectric layer D13 provided therebetween. The materials and configurations of the substrate SUB13, the first flux generating element FG13, the first insulating layer NL13, and the qubit QB13 may be the same as or similar to the materials and configurations of the substrate SUB11, the flux generating element FG11, the insulating layer NL11, and the qubit QB11 of FIG. 2.

A second insulating layer NL23 covering the qubit QB13 may be provided on the first insulating layer NL13. A second flux generating element FG23 may be provided on the second insulating layer NL23. The second flux generating element FG23 may be symmetrical to the first flux generating element FG13 by intervening the qubit QB13 therebetween. The second flux generating element FG23 may be formed of a superconducting material.

A power source V13 may be electrically connected to the first and second flux generating elements FG13 and FG23. A current may be applied to each of the first and second flux generating elements FG13 and FG23 using the power source V13 and flux Fx3 may be generated by the first and second flux generating elements FG13 and FG23. The flux Fx3 may be applied to the qubit QB13 in a vertical direction.

In the current exemplary embodiment, since the first and second flux generating elements FG13 and FG23 are symmetrically arranged on and under the qubit QB13 and the flux Fx3 is generated using the first and second flux generating elements FG13 and FG23, the intensity of the current applied to each of the first and second flux generating elements FG13 and FG23 to generate the flux Fx3 may be reduced by about ½. That is, compared to a case in which one flux generating element FG11 is used as in FIG. 2, if two flux generating elements FG13 and FG23 are used as in FIG. 8, the intensity of the current applied to each of the first and second flux generating elements FG13 and FG23 may be reduced by ½. In addition, since the first and second flux generating elements FG13 and FG23 are symmetrical to each other by intervening the qubit QB13 therebetween, the flux Fx3 generated thereby may be easily focused. As such, if the first and second flux generating elements FG13 and FG23 are used as in the current exemplary embodiment, generation of noise may be effectively suppressed.

In some cases, instead of electrically connecting one power source V13 to the first and second flux generating elements FG13 and FG23, a first power source may be electrically connected to the first flux generating element FG13 and a second power source may be electrically connected to the second flux generating element FG23. In this case, the first and second flux generating elements FG13 and FG23 may be controlled independently.

Meanwhile, the vertical distance between the first flux generating element FG13 and the qubit QB13 may be less than or equal to about 100 nm. Similarly, the vertical distance between the second flux generating element FG23 and the qubit QB13 may be less than or equal to about 100 nm. In other words, a height difference between a top surface of the first flux generating element FG13 and a bottom surface of the loop structure P13 may be less than or equal to about 100 nm, and a height difference between a bottom surface of the second flux generating element FG23 and a top surface of the loop structure P13 may be less than or equal to about 100 nm. The thicknesses of the first and second insulating layers NL13 and NL23 may be determined to satisfy the above condition. However, appropriate thickness ranges of the first and second insulating layers NL13 and NL23 may vary.

Figure 9:
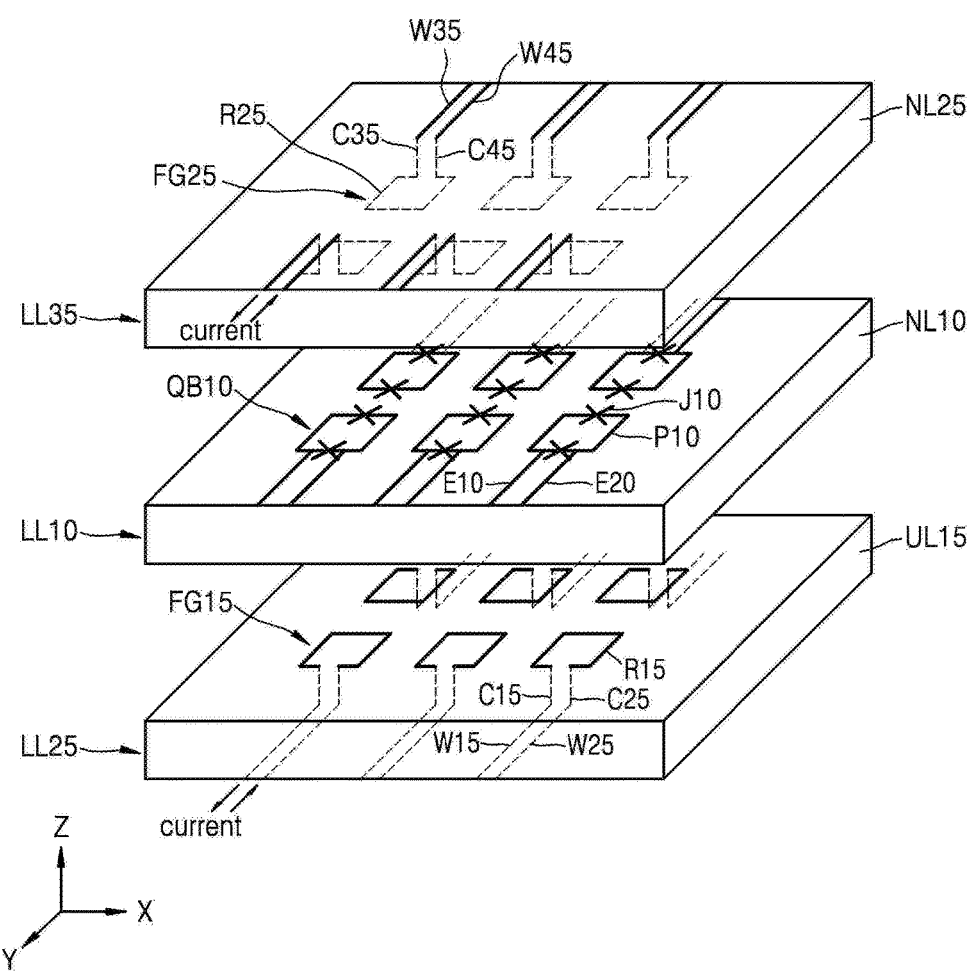
FIG. 9 is a perspective view of a multi-qubit device according to another exemplary embodiment.

FIG. 9 is a perspective view of a multi-qubit device according to another exemplary embodiment.

Referring to FIG. 9, the first layer structure LL10 described above in relation to FIG. 5 may be provided. The first layer structure LL10 may include the insulating layer NL10 (hereinafter referred to as a first insulating layer) and the qubits QB10 aligned thereon.

A second layer structure LL25 may be disposed under the first layer structure LL10. The second layer structure LL25 may have the same structure as the second layer structure LL25 described above in relation to FIG. 5. Accordingly, the second layer structure LL25 may include a plurality of flux generating elements FG15 (hereinafter referred to as first flux generating elements) that apply flux to the qubits QB10. The first flux generating elements FG15 may be provided on an underlayer UL15. In addition, the second layer structure LL25 may further include a plurality of wire patterns W15 and W25 connected to each first flux generating element FG15. The wire patterns W15 and W25 may be provided at a level (height) different from the level (height) of the first flux generating element FG15. The wire patterns W15 and W25 may be provided far away from the qubit QB10 compared to the first flux generating element FG15. A plurality of plugs C15 and C25 may be provided in a plurality of via holes provided in the underlayer UL15, and may interconnect the first flux generating element FG15 and the wire patterns W15 and W25 corresponding thereto. For example, the entire portion of the plurality of plugs C15 and C25 may be buried inside the second layer structure LL25 and the open loop structure R15 may be disposed on the second layer structure 25 to face the first layer structure LL10.

A third layer structure LL35 may be disposed above the first layer structure LL10. The third layer structure LL35 may be symmetrical to the second layer structure LL25 with respect to the first layer structure LL10. The third layer structure LL35 may include a plurality of second flux generating elements FG25. Each second flux generating element FG25 may have a partially open loop structure R25. In addition, the third layer structure LL35 may further include a plurality of wire patterns W35 and W45 connected to the second flux generating element FG25. The second flux generating element FG25 and the wire patterns W35 and W45 corresponding thereto may be provided at different levels (heights). The wire patterns W35 and W45 may be provided far away from the qubit QB10 compared to the second flux generating element FG25. The third layer structure LL35 may include the second flux generating element FG25 disposed on a first side of a second insulating layer NL25 and may include the wire patterns W35 and W45 disposed on a second side of the second insulating layer NL25. The first side of the second insulating layer NL25 may oppose the second side of the second insulating layer NL25, and the first side of the second insulating layer NL25 may face the first layer structure LL10.

Figure 10:
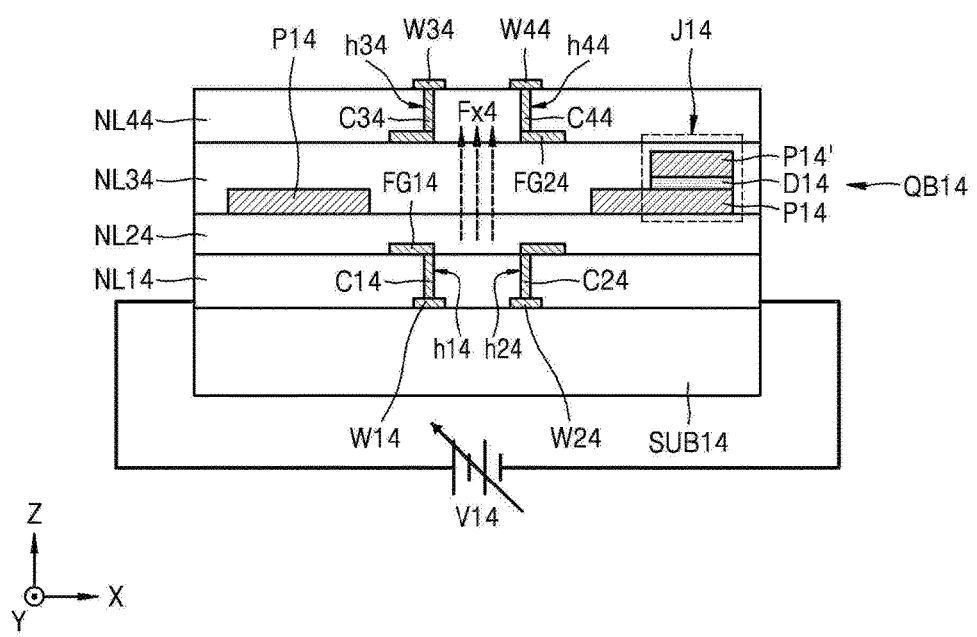
FIG. 10 is a cross-sectional view of a multi-qubit device corresponding to the exemplary embodiment of FIG. 9.

FIG. 10 is a cross-sectional view of a multi-qubit device corresponding to the exemplary embodiment of FIG. 9.

Referring to FIG. 10, a plurality of wire patterns W14 and W24 may be provided on a substrate SUB14. A first insulating layer NL14 covering the wire patterns W14 and W24 may be provided on the substrate SUB14. A first flux generating element FG14 may be provided on the first insulating layer NL14. A plurality of via holes h14 and h24 may be provided in the first insulating layer NL14, and a plurality of plugs C14 and C24 may be provided in the via holes h14 and h24. The plugs C14 and C24 may interconnect the wire patterns W14 and W24 and the first flux generating element FG14. In addition, the plugs C14 and C24 may be disposed to be perpendicular to the wire patterns W14 and W24 and the first flux generating element FG14.

A second insulating layer NL24 may be provided on the first insulating layer NL14, and a qubit QB14 may be provided on the second insulating layer NL24. The qubit QB14 may be the same as or similar to the qubit QB11 described above in relation to FIG. 2. Accordingly, the qubit QB14 may include a loop structure P14 formed of a superconducting material and may further include at least one Josephson junction J14 provided on the loop structure P14. The Josephson junction J14 may include two superconductors (a part of P14 and P14') and a dielectric layer D14 provided therebetween.

A third insulating layer NL34 covering the qubit QB14 may be provided on the second insulating layer NL24. A second flux generating element FG24 may be provided on the third insulating layer NL34. A fourth insulating layer NL44 covering the second flux generating element FG24 may be provided on the third insulating layer NL34. A plurality of wire patterns W34 and W44 connected to the second flux generating element FG24 may be provided on the fourth insulating layer NL44. A plurality of via holes h34 and h44 may be provided in the fourth insulating layer NL44, and a plurality of plugs C34 and C44 may be provided in the via holes h34 and h44. The plugs C34 and C44 may interconnect the second flux generating element FG24 and the wire patterns W34 and W44.

A power source V14 may be electrically connected to the first and second flux generating elements FG14 and FG24. Reference numeral Fx4 denotes flux generated by the first and second flux generating elements FG14 and FG24 and applied to the qubit QB14. Instead of electrically connecting one power source V14 to the first and second flux generating elements FG14 and FG24, a first power source may be electrically connected to the first flux generating element FG14 and a second power source may be electrically connected to the second flux generating element FG24.

The exemplary embodiment of FIG. 10 may simultaneously achieve advantages of the exemplary embodiment described above in relation to FIGS. 5 and 6 and advantages of the exemplary embodiment described above in relation to FIGS. 7 and 8. In other words, by separately providing the two flux generating elements FG14 and FG24 on and under the qubit QB14, generation of noise may be effectively suppressed. At the same time, by providing the lower wire patterns W14 and W24 and the upper wire patterns W34 and W44 on separate layers, generation of noise due to the wire patterns W14, W24, W34, and W44 may be effectively prevented and the degree of freedom in design may be improved.

Figure 11:
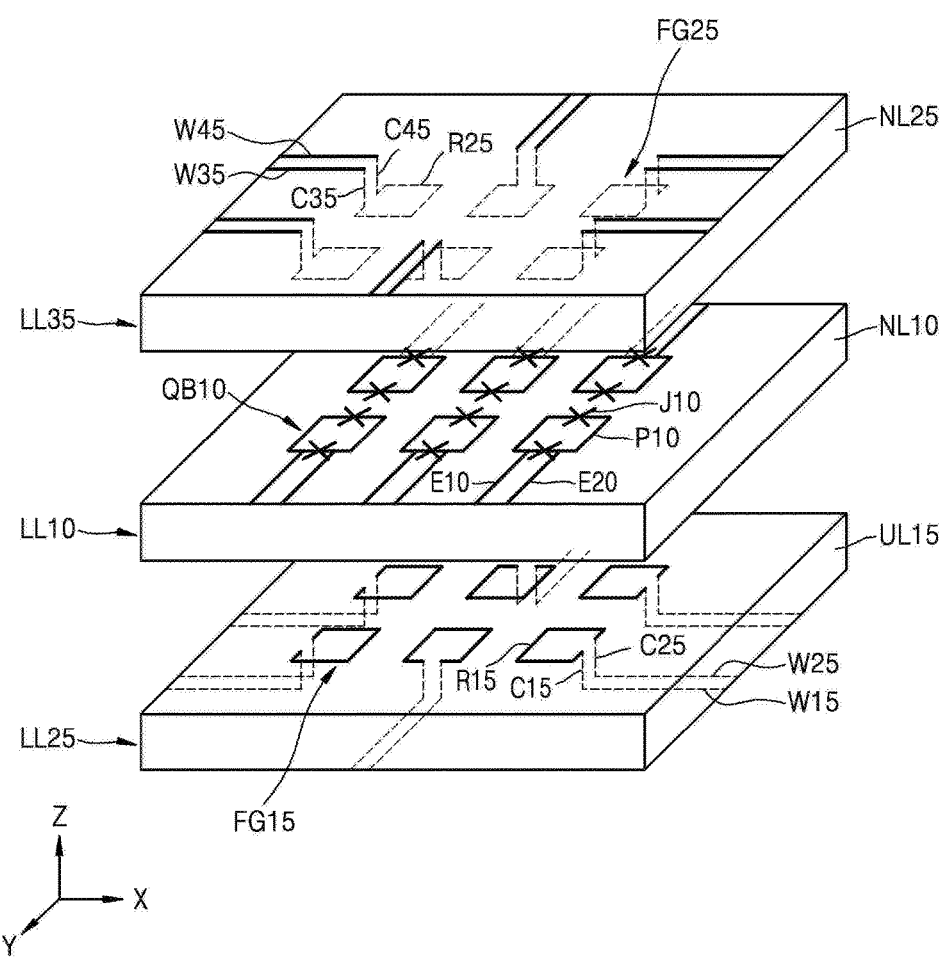
FIG. 11 is a perspective view of a multi-qubit device according to another exemplary embodiment.

FIG. 11 is a perspective view of a multi-qubit device according to another exemplary embodiment.

Referring to FIG. 11, the multi-qubit device according to the current exemplary embodiment may be similar to the multi-qubit device of FIG. 9. That is, lower wire patterns W15 and W25 and upper wire patterns W35 and W45 may be provided far away from a qubit QB10 using a via hole and plug structure. In this case, since generation of noise due to the wire patterns W15, W25, W35, and W45 is effectively prevented, the directions of the wire patterns W15, W25, W35, and W45 may be freely designed. Accordingly, at least a part of the lower wire patterns W15 and W25 may extend in a direction different from the direction of electrode lines E10 and E20 of the qubit QB10. Similarly, at least a part of the upper wire patterns W35 and W45 may also extend in a direction different from the direction of the electrode lines E10 and E20 of the qubit QB10. Therefore, according to the current exemplary embodiment, the degree of freedom in design may be improved.

According to another exemplary embodiment, a via hole and plug structure may be applied to only one of upper and lower flux generating elements, and wire patterns connected to the flux generating element having the via hole and plug structure may be designed in a direction different from the direction of electrode lines of a qubit. Examples thereof are illustrated in FIGS. 12 and 13.

Figure 12:
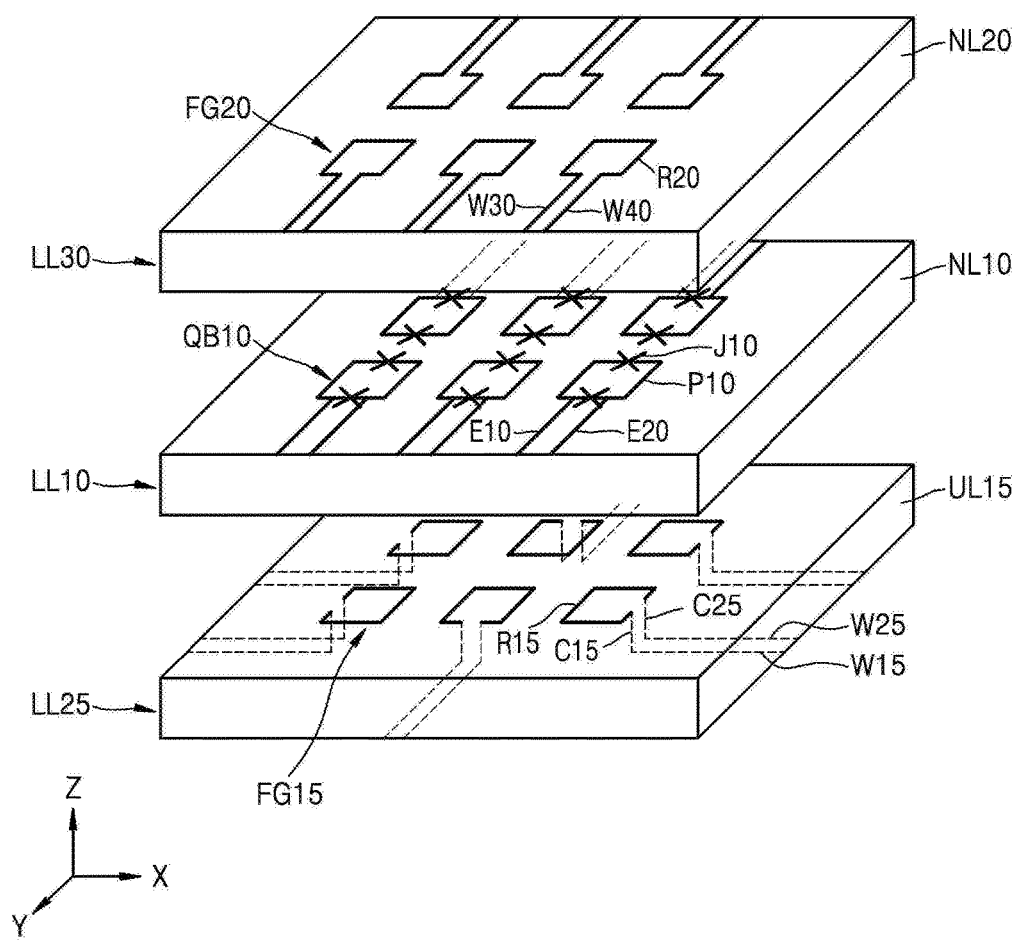
FIG. 12 is a perspective view of a multi-qubit device according to another exemplary embodiment.
Figure 13:
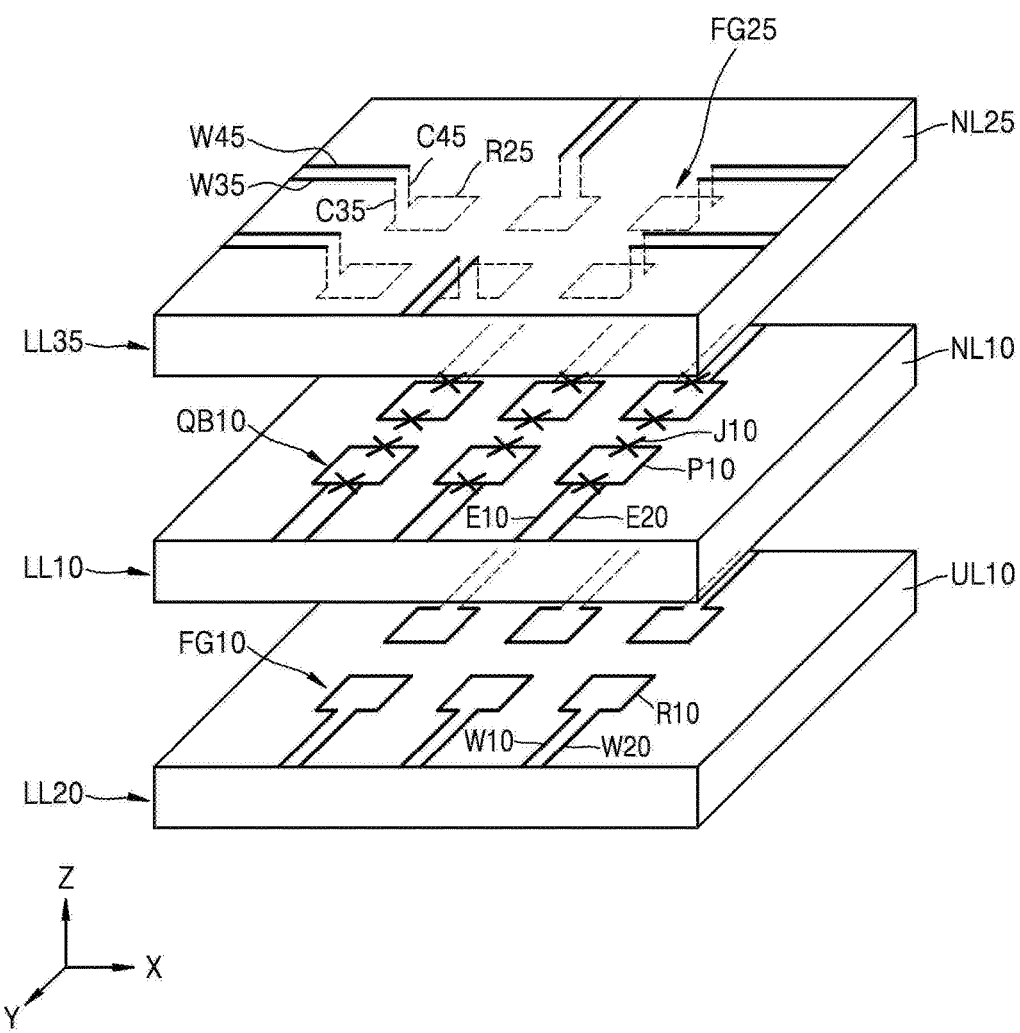
FIG. 13 is a perspective view of a multi-qubit device according to another exemplary embodiment.

FIG. 12 is a perspective view of a multi-qubit device according to another exemplary embodiment.

Referring to FIG. 12, a second layer structure LL25 including a plurality of first flux generating elements FG15 may be provided under a first layer structure LL10, and a third layer structure LL30 including a plurality of second flux generating elements FG20 may be provided above the first layer structure LL10. The first layer structure LL10 may be disposed between the second layer structure LL25 and the third layer structure LL30, and may be in contact with the second layer structure LL25 and the third layer structure LL30 when the manufacturing process of the multi-qubit device is complete. The first layer structure LL10 may be the same as or similar to the first layer structure LL10 described above in relation to FIGS. 7 and 9. The second layer structure LL25 may be the same as or similar to the second layer structure LL25 of FIG. 9. The third layer structure LL30 may be the same as or similar to the third layer structure LL30 of FIG. 7. Accordingly, the first layer structure LL10 may include a plurality of qubits QB10 and first and second electrode lines E10 and E20 connected to each qubit QB10. The second layer structure LL25 may include the first flux generating elements FG15 and first and second wire patterns W15 and W25 connected to each first flux generating element FG15. The first flux generating element FG15 and the first and second wire patterns W15 and W25 may be provided at different heights and may be electrically connected to each other by plugs C15 and C25 provided in via holes. The third layer structure LL30 may include the second flux generating elements FG20 and first and second wire patterns W30 and W40 connected to each second flux generating element FG20.

In the current exemplary embodiment, at least a part of the first and second wire patterns W15 and W25 connected to the first flux generating element FG15 may extend in a direction different from the direction of the first and second electrode lines E10 and E20. The first and second wire patterns W30 and W40 connected to the second flux generating element FG20 may extend in a direction equal to the direction of the first and second electrode lines E10 and E20.

FIG. 13 is a perspective view of a multi-qubit device according to another exemplary embodiment.

Referring to FIG. 13, a second layer structure LL20 including a plurality of first flux generating elements FG10 may be provided under a first layer structure LL10, and a third layer structure LL35 including a plurality of second flux generating elements FG25 may be provided above the first layer structure LL10. The first layer structure LL10 may be disposed between the second layer structure LL20 and the third layer structure LL35, and may be in contact with the second layer structure LL20 and the third layer structure LL35 when the manufacturing process of the multi-qubit device is complete. The first layer structure LL10 may be the same as or similar to the first layer structure LL10 described above in relation to FIGS. 7 and 9. The second layer structure LL20 may be the same as or similar to the second layer structure LL20 of FIG. 7. The third layer structure LL35 may be the same as or similar to the third layer structure LL35 of FIG. 9. Accordingly, the first layer structure LL10 may include a plurality of qubits QB10 and first and second electrode lines E10 and E20 connected to each qubit QB10. The second layer structure LL20 may include the first flux generating elements FG10 and first and second wire patterns W10 and W20 connected to each first flux generating element FG10. The third layer structure LL35 may include the second flux generating elements FG25 and first and second wire patterns W35 and W45 connected to each second flux generating element FG25. The second flux generating element FG25 and the first and second wire patterns W35 and W45 may be provided at different heights and may be electrically connected to each other by plugs C35 and C45 provided in via holes.

In the current exemplary embodiment, the first and second wire patterns W10 and W20 of the first flux generating element FG10 may extend in a direction equal to the direction of the first and second electrode lines E10 and E20, and at least a part of the first and second wire patterns W35 and W45 of the second flux generating element FG25 may extend in a direction different from the direction of the first and second electrode lines E10 and E20.

A multi-qubit device according to the afore-described exemplary embodiments may be used as a data storage apparatus of a quantum computer. Constituent elements of the quantum computer other than the multi-qubit device are well known and thus detailed descriptions thereof are not given herein. According to the exemplary embodiments, a multi-qubit device capable of easily controlling the state of qubits using flux may be implemented. In addition, a multi-qubit device capable of suppressing or preventing undesired interference between constituent elements or noise caused thereby may be implemented. Furthermore, a multi-qubit device capable of increasing the degree of freedom in designing and aligning a plurality of qubits and peripheral devices/circuits thereof may be implemented. Therefore, according to the exemplary embodiments, scalability of a multi-qubit device may be increased. Using such a multi-qubit device, a quantum computer may be easily implemented and performance thereof may be improved. Additionally, a multi-qubit device according to the afore-described exemplary embodiments may also be applied to a quantum mechanical apparatus/system other than a quantum computer.

The above detailed descriptions are not given to limit the scope of the present disclosure but should be understood as examples of embodiments. Specifically, it will be understood by those of ordinary skill in the art that the configurations of the multi-qubit devices described above in relation to FIGS. 1 to 13 may be variously changed. For example, it will be easily understood that the flux generating elements FG10 and FG11 may be provided on the qubits QB10 and QB11 and the alignment scheme of the qubits QB10 and QB11 or the directions and structures of the electrode lines E10 and E20 and the wire patterns W10 and W20 exemplary may be variously changed in FIGS. 1 and 2. In addition, throughout the embodiments, it will be understood that the structures of qubits and flux generating elements may be variously changed and qubits other than superconducting qubits may be used. Furthermore, it will be understood that a multi-qubit device according to the exemplary embodiments may be applied to a quantum computer and a variety of other quantum mechanical apparatuses/systems.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A multi-qubit device comprising:
a first layer structure disposed on a substrate in a vertical direction of the multi-quit device and comprising an array of a plurality of qubits; and
a second layer structure disposed between the substrate and the first layer structure and comprising a plurality of flux generating elements that apply flux to the plurality of qubits in the vertical direction,
wherein each of the plurality of qubits and each of the plurality of flux generating elements corresponding to the plurality of qubits have centers that are aligned on substantially a same axis in the vertical direction.

2. The multi-qubit device of claim 1, wherein each of the plurality of qubits is a superconducting qubit.

3. The multi-qubit device of claim 1, wherein each of the plurality of qubits comprises at least one Josephson junction.

4. The multi-qubit device of claim 1, wherein each of the plurality of qubits comprises a closed loop structure and at least one Josephson junction disposed on the closed loop structure, and further comprises a first electrode line and a second electrode line that extends in parallel to the first electrode from a side of the closed loop structure.

5. The multi-qubit device of claim 4, wherein each of the plurality of flux generating elements comprises a partially open loop structure and further comprises a first wire pattern and a second wire pattern that extends in parallel to first wire pattern from the partially open loop structure.

6. The multi-qubit device of claim 5, wherein the partially open loop structure has a size less than or equal to a size of the closed loop structure.

7. The multi-qubit device of claim 5, wherein the first and second wire patterns extend in a direction in which the first and second electrode lines extend.

8. The multi-qubit device of claim 5, wherein a distance between the first and second wire patterns is less than or equal to a distance between the first and second electrode lines.

9. The multi-qubit device of claim 1, wherein each of the plurality of flux generating elements comprises a superconducting material.

10. The multi-qubit device of claim 1, further comprising an insulating layer that has a thickness less than or equal to 100 nm and is disposed between the plurality of flux generating elements and the plurality of qubits.

11. The multi-qubit device of claim 1, further comprising a plurality of wire patterns connected to each of the plurality of flux generating elements,
wherein the plurality of wire patterns are disposed at a level different from a level of the plurality of flux generating elements in the vertical direction,
wherein the plurality of qubits are disposed closer to the plurality of flux generating elements than to the plurality of wire patterns.

12. The multi-qubit device of claim 11, further comprising:
an insulating layer that is disposed between the plurality of flux generating elements and the plurality of wire patterns and comprises a plurality of via holes; and
plugs that are disposed in the via holes and interconnect the plurality of flux generating elements and the plurality of wire patterns.

13. The multi-qubit device of claim 12, wherein the insulating layer has a thickness greater than or equal to 100 nm.

14. The multi-qubit device of claim 1, wherein the plurality of flux generating elements are a plurality of first flux generating elements,
wherein the multi-qubit device further comprises a third layer structure that faces the first layer structure, the first layer structure being disposed between the second layer structure and the third layer structure, and
wherein the third layer structure comprises a plurality of second flux generating elements that applies flux to the plurality of qubits in the vertical direction.

15. The multi-qubit device of claim 14, wherein the plurality of second flux generating elements are symmetrical to the plurality of first flux generating elements.

16. A quantum computer comprising the multi-qubit device of claim 1.

17. A multi-qubit device comprising:
a layer structure comprising a plurality of qubits;
a plurality of first flux generating elements that are disposed under the layer structure in a vertical direction of the multi-quit device and apply flux to the plurality of qubits in the vertical direction; and
a plurality of second flux generating elements that are disposed above and on the layer structure in the vertical direction and apply flux to the plurality of qubits in the vertical direction.

18. The multi-qubit device of claim 17, wherein each of the plurality of first flux generating elements is symmetrical to each of the plurality of second flux generating elements corresponding to the plurality of first flux generating elements.

19. The multi-qubit device of claim 17, wherein each of the plurality of qubits comprises a closed loop structure and at least one Josephson junction provided disposed on the closed loop structure, and further comprises a first electrode line and a second electrode line that extends in parallel to the first electrode line from a side of the closed loop structure.

20. The multi-qubit device of claim 19, wherein each of the plurality of first flux generating elements comprises a first partially open loop structure,
wherein each of the plurality of second flux generating elements comprises a second partially open loop structure, and
wherein the multi-qubit device further comprises:
a first wire pattern and a second wire pattern that extends in parallel to the first wire pattern from the first partially open loop structure; and
a third wire pattern and a fourth wire pattern that extends in parallel to the third wire pattern from the second partially open loop structure.

21. The multi-qubit device of claim 20, wherein the first and second partially open loop structures have a size less than or equal to a size of the closed loop structure.

22. The multi-qubit device of claim 20, wherein the first and second wire patterns and the third and fourth wire patterns extend in a direction in which the first and second electrode lines extend.

23. The multi-qubit device of claim 20, wherein the first and second wire patterns are disposed at a level different from a level of the first partially open loop structure in the vertical direction, and at least a part of the first and second wire patterns extend in a direction different from a direction in which the first and second electrode lines extend, and/or
 wherein the third and fourth wire patterns are disposed at
  a level different from a level of the second partially open loop structure in the vertical direction, and at least a part of the third and fourth wire patterns extend in a direction different from the direction of the first and second electrode lines.

24. The multi-qubit device of claim 17, wherein the plurality of first flux generating elements are disposed on a substrate,
 wherein the multi-qubit device further comprises:
  a first insulating layer that is disposed on the substrate and covers the plurality of first flux generating elements; and
  a second insulating layer that is disposed on the first insulating layer and covers the plurality of qubits,
 wherein the plurality of qubits are disposed on the first insulating layer and the plurality of second flux generating elements are disposed on the second insulating layer.

25. A quantum computer comprising the multi-qubit device of claim 17.

26. A multi-qubit device comprising:
 a first layer comprising a plurality of qubits; and
 a second layer that is disposed on the first layer, and comprises a plurality of flux generating elements that apply flux to the plurality of qubits, a plurality of wire patterns that provide current to the plurality of flux generating elements, and a plurality of plugs that are disposed perpendicular to the plurality of flux generating elements and the plurality of wire patterns and interconnect the plurality of flux generating elements and the plurality of wire patterns,
 wherein each of the plurality of flux generating elements is integrated with a corresponding one of the plurality of wire patterns and a corresponding one of the plurality of plugs.

* * * * *